(12) United States Patent
Song

(10) Patent No.: US 11,296,293 B2
(45) Date of Patent: Apr. 5, 2022

(54) MANUFACTURING METHOD OF ORGANIC ELECTROLUMINESCENT SUBSTRATE

(71) Applicant: BOE TECHNOLOGY GROUP CO., LTD., Beijing (CN)

(72) Inventor: Yingying Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 281 days.

(21) Appl. No.: 16/473,125

(22) PCT Filed: Dec. 5, 2018

(86) PCT No.: PCT/CN2018/119333
§ 371 (c)(1),
(2) Date: Jun. 24, 2019

(87) PCT Pub. No.: WO2019/200939
PCT Pub. Date: Oct. 24, 2019

(65) Prior Publication Data
US 2021/0273191 A1   Sep. 2, 2021

(30) Foreign Application Priority Data
Apr. 16, 2018   (CN) .......................... 201810337854.7

(51) Int. Cl.
*H01L 51/50*   (2006.01)
*H01L 27/32*   (2006.01)
*H01L 51/00*   (2006.01)
*H01L 51/52*   (2006.01)
*H01L 51/56*   (2006.01)

(52) U.S. Cl.
CPC ...... *H01L 51/5012* (2013.01); *H01L 27/3246* (2013.01); *H01L 51/0005* (2013.01); *H01L 51/525* (2013.01); *H01L 51/56* (2013.01)

(58) Field of Classification Search
None
See application file for complete search history.

(56) References Cited

U.S. PATENT DOCUMENTS

| | | |
|---|---|---|
| 7,795,800 B2 | 9/2010 | Lee et al. |
| 8,421,347 B2 | 4/2013 | Yamagishi et al. |
| 9,969,180 B2 | 5/2018 | Zhao et al. |

(Continued)

FOREIGN PATENT DOCUMENTS

| | | |
|---|---|---|
| CN | 1638553 A | 7/2005 |
| CN | 102474934 A | 5/2012 |

(Continued)

OTHER PUBLICATIONS

Search Report dated Feb. 27, 2019 issued in corresponding International Application No. PCT/CN2018/119333.

(Continued)

*Primary Examiner* — Michelle Mandala
(74) *Attorney, Agent, or Firm* — Nath, Goldberg & Meyer; Joshua B. Goldberg

(57) ABSTRACT

A manufacturing method of an organic electroluminescent substrate, comprising: providing a base including a display area and a non-display area; and inkjet-printing the base such that such that the base is completely covered by an inkjet-printed area. The present disclosure can improve the thickness uniformity of the film formed in the display area.

16 Claims, 5 Drawing Sheets

D-D'

(56) References Cited

U.S. PATENT DOCUMENTS

| | | | |
|---|---|---|---|
| 10,204,968 B2 | 2/2019 | Hou et al. | |
| 10,319,793 B2 | 6/2019 | Hou et al. | |
| 2004/0095060 A1* | 5/2004 | Ushifusa | H05B 33/04 |
| | | | 313/495 |
| 2005/0266169 A1 | 12/2005 | Seki et al. | |
| 2013/0341607 A1* | 12/2013 | Heo | H01L 27/3279 |
| | | | 257/40 |
| 2014/0084258 A1 | 3/2014 | Choi | |
| 2015/0028308 A1* | 1/2015 | Lee | H01L 51/56 |
| | | | 257/40 |
| 2016/0257138 A1 | 9/2016 | Zhao et al. | |
| 2018/0212002 A1 | 7/2018 | Hou et al. | |

FOREIGN PATENT DOCUMENTS

| | | |
|---|---|---|
| CN | 104260554 A | 1/2015 |
| CN | 104766931 A | 7/2015 |
| CN | 104779200 A | 7/2015 |
| CN | 105118845 A | 12/2015 |
| CN | 206134682 U | 4/2017 |
| CN | 107799575 A | 3/2018 |
| CN | 108428808 A | 8/2018 |
| JP | 2011187208 A | 9/2011 |
| JP | 2011198766 A | 10/2011 |
| KR | 20050068819 A | 7/2005 |
| KR | 1020050068819 A | 7/2005 |
| WO | 2013/111300 A1 | 8/2013 |
| WO | 2013111300 A1 | 8/2013 |

OTHER PUBLICATIONS

Office Action dated Mar. 4, 2019 issued in corresponding Chinese Application No. 201810337854.7.

Office Action dated Jul. 19, 2019 issued in corresponding Chinese Application No. 201810337854.7.

First Office Action dated Jun. 22, 2021 for application No. KR 10-2020-7017024 with English translation attached.

Korean Grant of Patent dated Dec. 14, 2021 corresponding to application No. 10-2020-7017024.

Extended European Search Report dated Dec. 6, 2021 corresponding to application No. 18915283.8-1211.

Indian Office Action dated Oct. 26, 2021 corresponding to application No. 201947033628.

* cited by examiner

B-B'

C-C'

D-D'

MANUFACTURING METHOD OF ORGANIC ELECTROLUMINESCENT SUBSTRATE

This is a National Phase Application filed under 35 U.S.C. 371 as a national stage of PCT/CN2018/119333, filed Dec. 5, 2018, an application claiming the benefit of Chinese Application No. 201810337854.7, filed Apr. 16, 2018, the content of each of which is hereby incorporated by reference in its entirety.

FIELD OF THE INVENTION

The present disclosure relates to, but is not limited to, the field of organic electroluminescent display technology, and in particular to a manufacturing method for an organic electroluminescent substrate.

BACKGROUND

In the organic electroluminescent substrate, the film formation method of the luminescent film layer mainly includes inkjet printing, nozzle coating, spin coating, screen printing, and the like. Inkjet printing technology is considered as an important way to achieve mass production due to its high material utilization and large-sized product. However, when inkjet printing is performed, since the solvent atmosphere is inconsistent in a central area and an edge area of a display area, the morphology and thickness of the film formed in pixels in the central area and the edge area of the display area are inconsistent, thereby affecting display effect of a display device.

SUMMARY

The present disclosure is intended to address at least one of the technical problems in the related art to propose a manufacturing met od of an organic electroluminescent substrate.

An embodiment of the present disclosure provides a manufacturing method of an organic electroluminescent substrate, comprising: providing a base including a display area and a non-display area; and inkjet-printing the base such that the base is completely covered by an inkjet-printed area.

Optionally, wherein prior to the step of inkjet-printing the base, the manufacturing method further comprises: forming a spacer layer on the non-display area of the base, the spacer layer being made of an inorganic material.

Optionally, prior to the step of inkjet-printing the base, the manufacturing method further comprises: forming a pixel defining layer on the display area of the base, the pixel defining layer including a plurality of protrusions arranged in a matrix, the plurality of protrusions defining a plurality of accommodation slots for receiving ink; and collecting the ink for inkjet-printing the display area of the base in the accommodation slots.

Optionally, each protrusion has a trapezoidal shape in cross section.

Optionally, after the step of inkjet-printing the base, the manufacturing method further comprises: curing the ink on the base to form a luminescent film layer; and removing the luminescent film layer on the non-display area.

Optionally, the step of removing the luminescent film layer on the non-display area comprises: heating the non-display area with infrared to sublimate the luminescent film layer on the non-display area.

Optionally, at least a portion of a top surface of the spacer layer is lower than a top surface of the protrusions.

Optionally, the step of forming the spacer layer on the non-display area of the base comprises: forming a layer of inorganic material; and patterning the layer of inorganic material to form the spacer layer in the non-display area.

Optionally, the spacer layer is formed before the pixel defining layer.

Optionally, in a length direction of the display area, a distance from a boundary of an inkjet-printed area to a boundary of the display area is 30% larger than a length of the display area; and in a width direction of the display area, a distance from the boundary of the inkjet-printed area to the boundary of the display area is 30% larger than a width of the display area.

Optionally, the inkjet-printed area is divided into a plurality of inkjet-printed sub-areas and a width of each inkjet-printed sub-area is equal to a print width of an inkjet-print head, and the step of inkjet-printing the base comprises: performing the inkjet-printing on the inkjet-printed sub-areas one by one; moving the inkjet-print head in an extending direction of the inkjet-printed sub-area when printing in any one of the inkjet-printed sub-areas; and moving the inkjet-print head in opposite directions in adjacent two inkjet-printed sub-areas.

Optionally, the inkjet-print head is located in an inkjet-printed sub-area outside an area of the base at initial time.

BRIEF DESCRIPTION OF THE DRAWINGS

The accompanying drawings are intended to provide a further understanding of the disclosure. The drawings constitute a part of the specification, and are used to explain the present disclosure together with the following specific embodiments, but do not constitute a limitation of the present disclosure. In the drawings:

FIG. 4b is a cross-sectional view taken along line B-B' of FIG. 4a;

FIG. 5b is a cross-sectional view taken along line C-C' of FIG. 5a;

FIG. 6b is a cross-sectional view taken along line D-D' of FIG. 6a;

LIST OF REFERENCE NUMERALS

10—base; 11—spacer layer; 11*a*—recess; 12—pixel defining layer; 121—protrusion; AA—display area; NA—non-display area; P—inkjet-printed area; P1—inkjet-printed sub-area; and V—accommodation slot.

DETAILED DESCRIPTION OF THE EMBODIMENTS

The specific embodiments of the present disclosure will be described in detail below with reference to the accompanying drawings. It is to be understood that the specific embodiments described herein are provided for illustrative purposes only and are not intended to limit the disclosure.

When inkjet printing is performed, the solvent atmosphere is thinner at an edge of a printing area while the solvent atmosphere is thicker in the middle of the printing area. In the related art, when the inkjet printing is performed, the area of the inkjet printing does not exceed a display area or exceeds one or two pixels of the display area. This may result in a large difference between the solvent atmosphere at the edge of the display area and the solvent atmosphere in the middle of the display area, resulting in a difference in film thickness and pixel morphology between the film formed in the pixels in the middle of the display area and the pixels at the edge of the display area.

Figure 1:
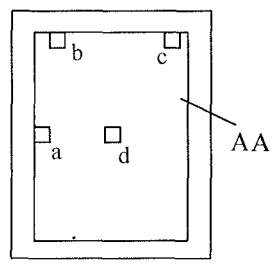
FIG. 1 is a schematic diagram showing four detection regions formed on an organic electroluminescence display substrate.
Figure 2:
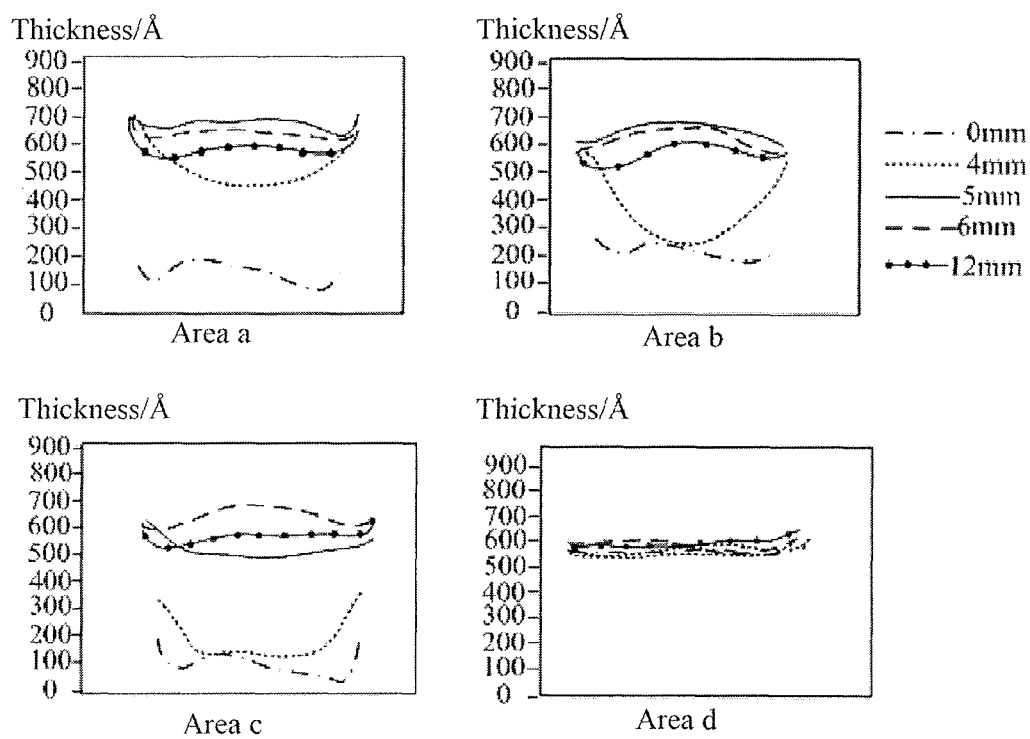
FIG. 2 is a schematic diagram showing a distribution of film thickness formed in pixels at different positions on a detection region.
Figure 3:
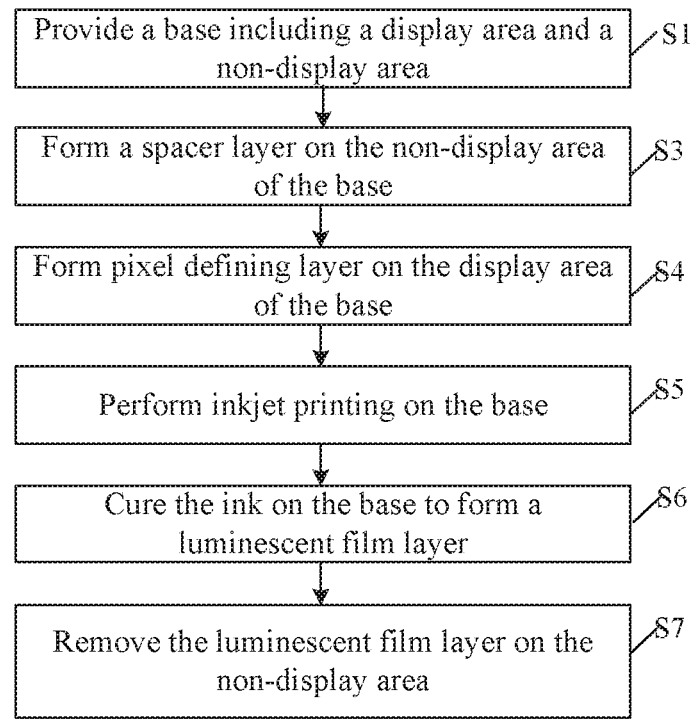
FIG. 3 is a flow chart showing a manufacturing method of an organic electroluminescent substrate according to an embodiment of the present disclosure.

FIG. 1 is a schematic diagram showing four detection regions formed on an organic electroluminescence display substrate; and FIG. 2 is a schematic diagram showing a distribution of film thickness formed in pixels at different positions on a detection region. In FIG. 2, each curve represents a thickness distribution of a film layer formed in a pixel from the left side to the right side of the pixel; different curves represent a thickness distribution of film layers formed in the pixels spaced 0 mm, 4 mm, 5 mm, 6 mm and 12 mm from the edge of the detection region close to the display area, respectively. As shown in FIGS. 1 and 2, in the detection region a, the detection region b, and the detection region c close to the edge of the display area AA, the film layers formed in the pixels at different positions have a significant thickness difference; and in the detection region d near the center of the display area, the film layers formed in the pixels at different positions have a small thickness difference. In the detection region a, the detection region b, and the detection region c, only the thicknesses of the film layers formed in the pixels spaced 12 mm from the edges of the detection regions have a small difference with respect to the thickness of the fill layer formed in the pixel in the detection region d, while the thicknesses of the film layers formed in the pixels spaced 0 mm, 4 mm, 5 mm, and 6 mm from the edges of the detection regions have a significant difference with respect to the thickness of the film layer formed in the pixel in the detection region d. From above, for the entire display area AA, the thickness of the film layer formed in the pixel close to the edge of the display area AA is significantly different from the thickness of the film layer formed in the pixel near the center of the display area AA.

In order to improve the uniformity of the film formation in the display area, there is provided a manufacturing method of an organic electroluminescent substrate according to an embodiment of the present disclosure, including:

providing a base including a display area and a non-display area; and inkjet-printing the base such that the base is completely covered by an inkjet-printed area.

Compared with the related art, according to the present disclosure, in the manufacturing of the organic electroluminescent substrate, the inkjet-printed area covers the entire base. Therefore, there is a certain distance between the edge of the display area and the edge of the inkjet-printed area, such that pixels at the edge and in the middle of the display area are both in a rich solvent atmosphere. In this way, the film layers formed in the pixels at the edge and in the middle of the display area have similar thickness and morphology, thereby improving the uniformity of film formation in the display area and improving the uniformity of display.

Specifically, in a length direction of the display area, a distance from a boundary of the inkjet-printed area to a boundary of the display area is 30% greater than a length of the display area; and in a width direction of the display area, a distance from the boundary of the inkjet-printed area to the boundary of the display area is 30% greater than a width of the display area. In this way, the distance between the edge of the display area and the edge of the inkjet-printed area can be increased to further reduce the difference in solvent atmosphere between the edge and the middle of the display area, thereby further improving the uniformity of film formation at different positions of the display area.

The manufacturing method of the organic electroluminescent substrate according to the present disclosure will be described in detail below with reference to FIGS. 3 to 8.

The manufacturing method may include: S1, providing a base 10 including a display area AA and a non-display area NA. The display area AA of the base 10 may be provided with structures such as a thin film transistor passivation layer, and an anode of a light emitting unit.

Figure 4A:
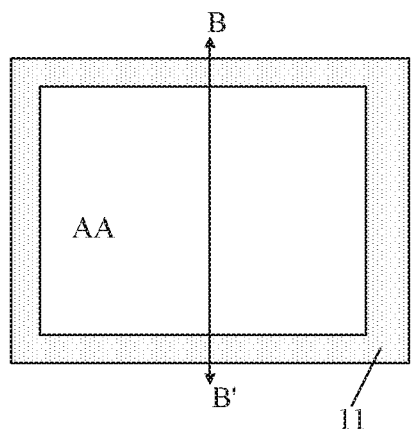
FIG. 4a is a top plan view of a spacer layer formed on a base according to an embodiment of the present disclosure.
Figure 4B:
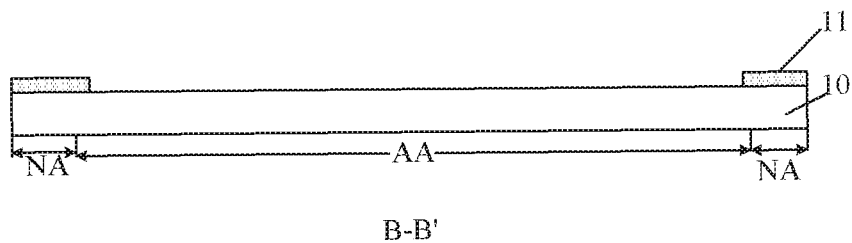

The manufacturing method further includes: S2, forming a spacer layer 11 on the non-display area NA of the base 10, as shown in FIGS. 4*a* and 4*h*. For example, the thickness of the spacer layer 11 may be between 0.5 um and 1.5 µm. The spacer layer 11 is made of an inorganic material. The inorganic material array specifically include at least one of a nitride of silicon, an oxide of silicon, and an oxynitride of silicon. The step S2 may specifically include: forming a layer of an inorganic material, wherein the inorganic material includes a material layer of any one of a nitride of silicon, an oxide of silicon, and an oxynitride of silicon; and patterning the layer of the inorganic material, including, for example, exposure, development and etching, to remove the layer of the inorganic material layer in the display area AA, thereby forming the spacer layer 11 in the non-display area. NA.

Figure 5A:
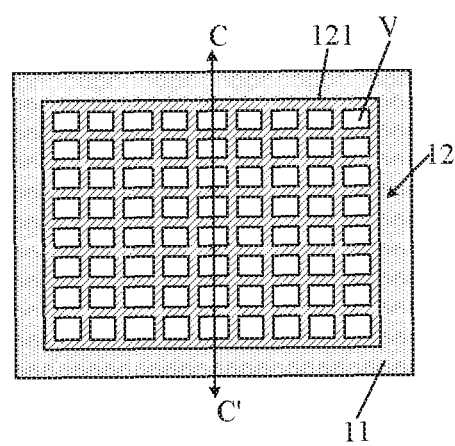
FIG. 5a is a top plan view of a pixel defining layer formed on the base according to an embodiment of the present disclosure.
Figure 5B:
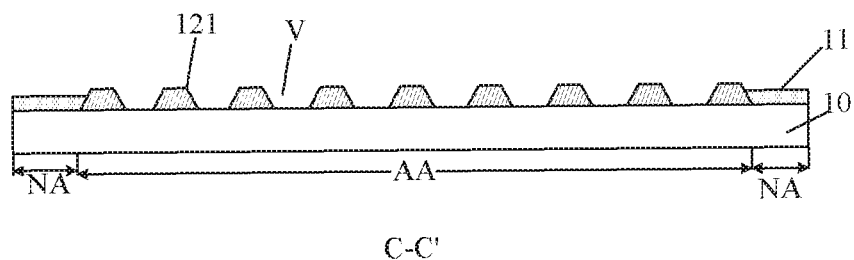

The manufacturing method further includes: S3, forming a pixel defining layer 12 on the display area. AA of the base 10, as shown in FIGS. 5*a* and 5*b*. The pixel defining layer 12 includes a plurality of protrusions 121 arranged in a matrix. As shown in FIG. 5*b*, each of the protrusions 121 has a trapezoidal shape in cross section. Therefore, the protrusions 121 may define a plurality of accommodation slots V for receiving ink, and each of the accommodation slots V corresponds to a pixel. The step S3 may specifically include: forming a layer of an organic material on the base 10, wherein the layer of the organic material includes an organic fluorine-containing resin material; and patterning the layer of the organic material, including, for example, exposure and development, to form the pixel defining layer 12.

Figure 6A:
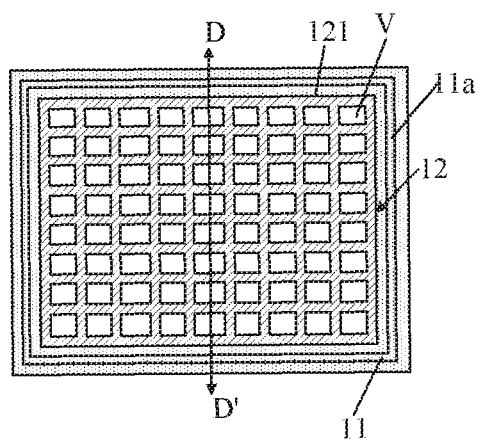
FIG. 6a is a top plan view of a spacer layer and a pixel defining layer according to another embodiment of the present disclosure.
Figure 6B:
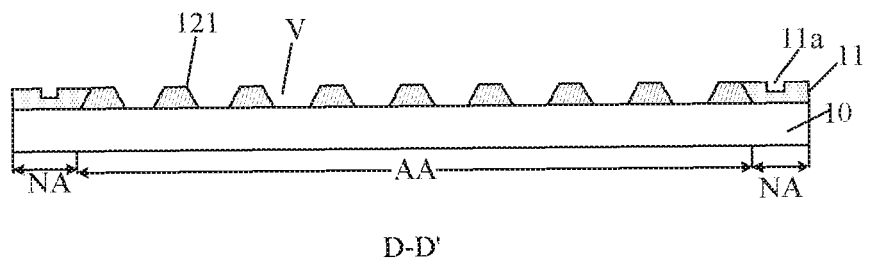

According to an exemplary embodiment, in steps S2 and S3, at least a portion of a top surface of the spacer layer 11 is lower than a top surface of the protrusions. The top surface of the spacer layer 11 is the surface away from the base 10. Specifically, the entire top surface of the spacer layer 11 may be lower than the surface of the protrusions away from the base 10, as shown in FIGS. 5a and 5b, or a portion of the top surface of the spacer layer 11 may be lower than the top surface of the protrusions, as shown in FIGS. 6a and 6b. In the case where a portion of the top surface of the spacer layer 11 is lower than the top surface of the protrusions, a recess 11a may be formed in the spacer layer 11. This arrangement can prevent the ink printed on the spacer layer 11 from flowing back into some of the accommodation slots V to cause unevenness of the film layer formed in the display area AA.

Figure 7:
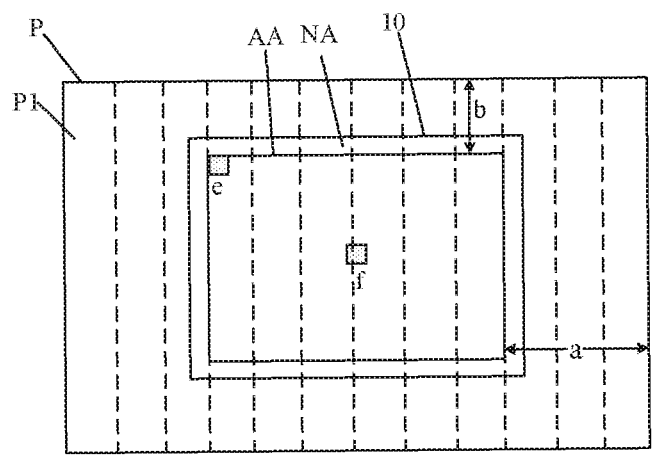
FIG. 7 is a schematic diagram showing a positional relationship between an inkjet-printed area and a base according to an embodiment of the present disclosure.

The manufacturing method may further include: S4, performing inkjet printing on the base 10. The relative positional relationship between the inkjet-printed area P and the display area AA is as shown in FIG. 7. In the length direction of the display area AA (the left-right direction in FIG. 7), the distance a from the boundary of the inkjet-printed area P to the boundary of the display area AA is 30% larger than the length of the display area AA; and in the width direction of the display area AA (the up-down direction in FIG. 7), the distance b from the boundary of the inkjet-printed area P to the boundary of the display area AA is 30% larger than the width of the display area AA. The ink that performs inkjet printing on the display area AA of the base 10 is collected in the accommodation slots V. The ink may be a solution for forming a functional film layer of the light-emitting unit, for example, a solution for forming a hole injection layer, a solution for forming a hole transport layer, and a solution for forming a light-emitting layer. When inkjet printing is performed, the base 10 can be placed on a support table.

Since the non-display area NA is provided with the spacer layer 11, the ink printed on the non-display area NA is formed on the spacer layer 11 to space apart from a signal line on the non-display area of the base 10, thereby preventing the signal line from being short-circuited.

Figure 8:
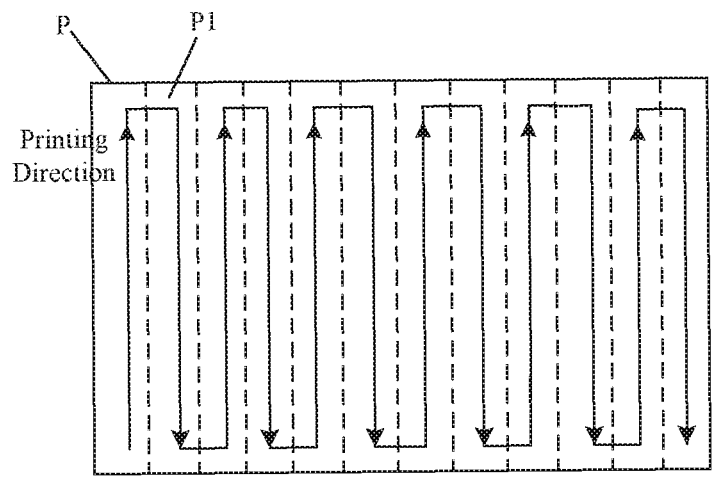
FIG. 8 is a schematic diagram showing a printing direction in inkjet printing according to an embodiment of the present disclosure.

According to an exemplary embodiment, with reference to FIGS. 7 and 8, the inkjet-printed area P is divided into a plurality of inkjet-printed sub-areas P1, each inkjet-printed sub-area P1 extends in the width direction of the display area AA, and a width of each inkjet-printed sub-area P1 is equal to a print width of an inkjet-print head. Step S4 may include: performing the inkjet-printing of ink on the plurality of inkjet-printed sub-areas P1. Printing directions of the inkjet-print head in each of the inkjet-printed sub-areas P1 are indicated by arrows in FIG. 8. When printing in any one of the inkjet-printed sub-areas P1, the inkjet-print head moves in an extending direction of the inkjet-printed sub-area P1; and the inkjet-print head moves in opposite directions in adjacent two inkjet-printed sub-areas P1. This can help to improve the uniformity of the solvent atmosphere throughout the print area.

The inkjet-print head is located in an inkjet-printed sub-area P1 outside an area of the base 10 at initial time (i.e., the leftmost inkjet-printed sub-area P1 in FIGS. 7 and 8). In inkjet printing, the inkjet-print head needs to gradually accelerate from zero to a target speed. The inkjet-print head first prints a inkjet-printed sub-area P1 completely outside the area of the base 10, such that the inkjet-print head can accelerate to the target speed before printing on the base 10, thereby ensuring that the inkjet-print head prints the base 10 at a uniform speed to further improve the uniformity of film formation in the display area.

The manufacturing method may further include: S5, curing the ink on the base 10 to form a luminescent film layer.

The manufacturing method further includes: S6, removing the luminescent film layer on the non-display area NA to remove dummy pixels other than the display area AA, thereby facilitating the manufacture of a display device having a narrow frame.

According to an exemplary embodiment, step S6 may include heating the non-display area NA with infrared to sublimate the luminescent film layer on the non-display area. NA. More specifically, the step of heating the non-display area NA with the infrared includes irradiating the non-display area NA with an infrared laser having a wavelength ranging from 10.5 μm to 10.7 μm. In practical applications, infrared heating can be performed using a carbon dioxide laser having a wavelength of 10.6 μm.

Since the non-display area NA is provided with the spacer layer 11 made of the inorganic material, it is possible to prevent the infrared heating process from damaging the structure of the spacer layer 11, such that the spacer layer 11 can protect the signal line on the non-display area NA of the base 10.

Figure 9:
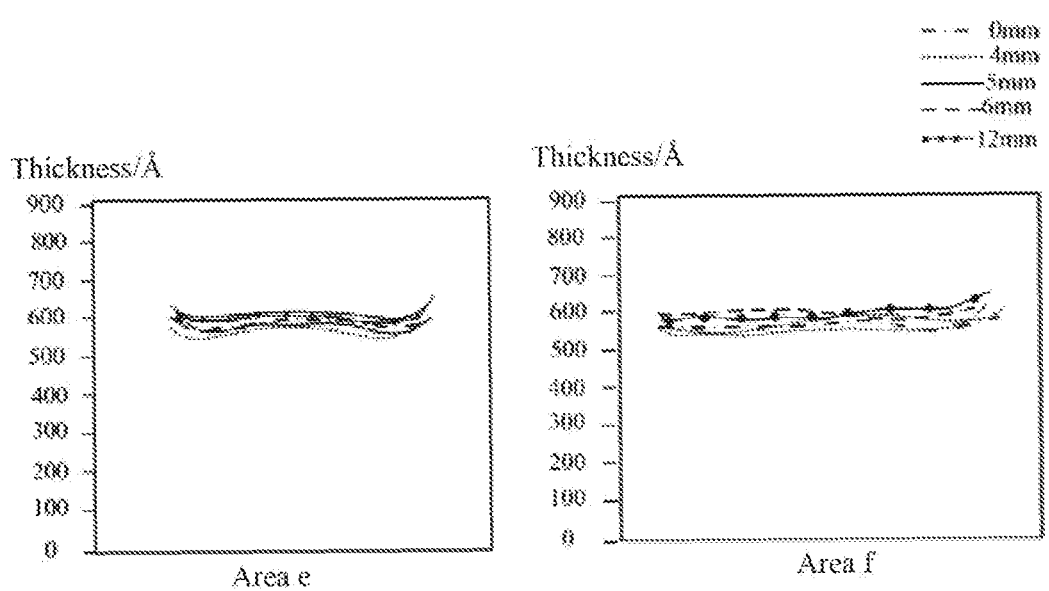
FIG. 9 is a schematic diagram showing a distribution of film thicknesses formed in pixels at different positions in a detection region e and a detection region f in FIG. 7.

FIG. 9 is a schematic diagram showing a distribution of film thicknesses formed in pixels at different positions in a detection region e and a detection region f in FIG. 7. It can be seen that in the organic electroluminescence display device manufactured by the manufacturing method according to the present disclosure, the thickness of the film layer formed in the pixels at different positions ranges from 500 to 600 Å in the detection regions e and f, and the difference in the thickness of the film layers is small, so that the uniformity of display brightness in different areas of the product can be improved.

It is to be understood that the above embodiments are merely exemplary embodiments employed to explain the principles of the present disclosure, but the present disclosure is not limited thereto. Various modifications and improvements be made by those skilled in the art without departing from the spirit and scope of the disclosure, and such modifications and improvements are also considered to be within the scope of the disclosure.

The invention claimed is:

1. A manufacturing method of an organic electroluminescent substrate, comprising:
   providing a base including a display area and a non-display area; and
   inkjet-printing the base such that the base is completely covered by an inkjet-printed area, wherein prior to the step of inkjet-printing the base, the manufacturing method further comprises:
   forming a spacer layer on the non-display area along an entire perimeter of the base, the spacer layer being made of an inorganic material:
   forming a pixel defining layer on the display area of the base, the pixel defining layer being made of organic material and including a plurality of protrusions arranged in a matrix, and the plurality of protrusions defining a plurality of accommodation slots for receiving ink; and
   collecting the ink for inkjet-printing the display area of the base in the accommodation slots only.

2. The manufacturing method according to claim 1, wherein each protrusion has a trapezoidal shape in cross section.

3. The manufacturing method according to claim 1, wherein after the step of inkjet-printing the base, the manufacturing method further comprises:
   curing the ink on the base to form a luminescent film layer; and removing the luminescent film layer on the non-display area.

4. The manufacturing method according to claim 3, wherein the step of removing the luminescent film layer on the non-display area comprises:
heating the non-display area with infrared to sublimate the luminescent film layer on the non-display area.

5. The manufacturing method according to claim 1, wherein at least a portion of a top surface of the spacer layer is lower than a top surface of the protrusions.

6. The manufacturing method according to claim 1, wherein the step of forming the spacer layer on the non-display area of the base comprises:
forming a layer of inorganic material; and
patterning the layer of inorganic material to form the spacer layer in the non-display area.

7. The manufacturing method according to claim 1, wherein the spacer layer is formed before the pixel defining layer.

8. The manufacturing method according to claim 1, wherein
in a length direction of the display area, a distance from a boundary of an inkjet-printed area to a boundary of the display area is 30% larger than a length of the display area; and
in a width direction of the display area, a distance from the boundary of the inkjet-printed area to the boundary of the display area is 30% larger than a width of the display area.

9. The manufacturing method according to claim 1, wherein the inkjet-printed area is divided into a plurality of inkjet-printed sub-areas and a width of each inkjet-printed sub-area is equal to a print width of an inkjet-print head, and the step of inkjet-printing the base comprises:
performing the inkjet-printing on the inkjet-printed sub-areas one by one;
moving the inkjet-print head in an extending direction of the inkjet-printed sub-area when printing in any one of the inkjet-printed sub-areas; and
moving the inkjet-print head in opposite directions in adjacent two inkjet-printed sub-areas.

10. The manufacturing method according to claim 9, wherein the inkjet-print head is located in an inkjet-printed sub-area outside an area of the base at initial time.

11. The manufacturing method according to claim 6, wherein the inorganic material comprises at least one of a nitride of silicon, an oxide of silicon, and an oxynitride of silicon.

12. The manufacturing method according to claim 6, wherein the step of patterning the layer of inorganic material to form the spacer layer in the non-display area comprises:
performing exposure, development and etching on the layer of the inorganic material to remove the layer of the inorganic material layer in the display area.

13. The manufacturing method according to claim 1, wherein the step of forming the pixel defining layer on the display area of the base comprises:
forming a layer of an organic material on the base, wherein the layer of the organic material includes an organic fluorine-containing resin material; and
patterning the layer of the organic material to form the pixel defining layer.

14. The manufacturing method according to claim 4, wherein the step of heating the non-display area with the infrared to sublimate the luminescent film layer on the non-display area comprises:
irradiating the non-display area with an infrared laser having a wavelength ranging from 10.5 μm to 10.7 μm.

15. The manufacturing method according to claim 14, wherein the infrared laser is a carbon dioxide laser having a wavelength of 10.6 μm.

16. An organic electroluminescent substrate manufactured by the manufacturing method according to claim 1, wherein in the organic electroluminescent substrate, a thickness of a film layer formed in pixels at different positions ranges from 500 to 600 Å.

* * * * *